United States Patent [19]
Zhang et al.

[11] Patent Number: 5,508,209
[45] Date of Patent: Apr. 16, 1996

[54] METHOD FOR FABRICATING THIN FILM TRANSISTOR USING ANODIC OXIDATION

[75] Inventors: Hongyong Zhang; Hideto Ohnuma; Naoaki Yamaguchi; Yasuhiko Takemura, all of Kanagawa, Japan

[73] Assignee: Semiconductor Energy Laboratory Co., Ltd., Kanagawa, Japan

[21] Appl. No.: 312,795

[22] Filed: Sep. 27, 1994

[30] Foreign Application Priority Data

Oct. 1, 1993 [JP] Japan ............... 5-269778

[51] Int. Cl.$^6$ ............... H01L 21/336
[52] U.S. Cl. ............... 437/21; 437/24; 437/41; 437/101
[58] Field of Search ............... 437/21, 101, 41, 437/24; 257/57, 66

[56] References Cited

U.S. PATENT DOCUMENTS

| | | | |
|---|---|---|---|
| 4,772,927 | 9/1988 | Saito et al. ............... | 437/21 |
| 5,287,205 | 2/1994 | Yamazaki et al. ............... | 359/57 |
| 5,289,030 | 2/1994 | Yamazaki et al. ............... | 257/410 |
| 5,308,998 | 5/1994 | Yamazaki et al. ............... | 257/57 |

Primary Examiner—Mary Wilczewski
Attorney, Agent, or Firm—Sixbey, Friedman, Leedom & Ferguson; Gerald J. Ferguson, Jr.; Eric J. Robinson

[57] ABSTRACT

In a thin film transistor (TFT), a mask is formed on a gate electrode, and a porous anodic oxide is formed in both sides of the gate electrode using a relatively low voltage. A barrier anodic oxide is formed between the gate electrode and the porous anodic oxide and on the gate electrode using a relatively high voltage. A gate insulating film is etched using the barrier anodic oxide as a mask. The porous anodic oxide is selectively etched after etching barrier anodic oxide, to obtain a region of an active layer on which the gate insulating film is formed and the other region of the active layer on which the gate insulating film is not formed. An element including at least one of oxygen, nitrogen and carbon is introduced into the region of the active layer at high concentration in comparison with a concentration of the other region of the active layer. Further, N- or P-type impurity is introduced into the active layer. Accordingly, high resistance impurity regions are formed in both sides of a channel forming region.

18 Claims, 7 Drawing Sheets

METHOD FOR FABRICATING THIN FILM TRANSISTOR USING ANODIC OXIDATION

BACKGROUND OF THE INVENTION

1. Field of the Invention

The present invention relates to an insulated gate thin film transistor formed on an insulating material (e.g., glass) or a material such as a silicon wafer having thereon an insulating film (e.g., silicon oxide), and to a method for fabricating the same. The present invention is particularly effective for thin film transistors fabricated on a glass substrate having a glass transition temperature (deformation temperature or deformation point) of 750° C. or less. The thin film transistor according to the present invention is useful for driver circuits of, for example, active matrix liquid crystal displays and image sensors, as well as for three dimensional integrated circuits.

2. Description of the Related Art

Thin film transistors (referred to simply hereinafter as "TFTs") are widely employed for driving, for example, liquid crystal displays of active matrix type and image sensors. TFTs of crystalline silicon having a higher electric field mobility are also developed as an alternative for amorphous silicon TFTs to obtain high speed operation. However, TFTs with further improved device characteristics and durability can be obtained by forming an impurity region having a high resistance (high resistance drain; HRD).

FIG. 4A shows a cross section view of a conventional TFT having an HRD. The active layer comprises low resistance regions 1 and 5, a channel forming region 3, and high resistance regions 2 and 4 formed therebetween. A gate insulating film 6 is provided to cover the active layer, and a gate electrode 7 is formed on the channel forming region 3 through the gate insulating film 6. An interlayer dielectric 8 is formed to cover the gate electrode 7, and source/drain electrodes 9 and 10 are connected to the low resistance regions 1 and 5. At least one of the elements selected from oxygen, nitrogen, and carbon is introduced into the high resistance regions 2 and 4.

The introduction of at least one of the elements above, however, requires the use of photolithography. Thus, it is difficult to form high resistance regions on the edge portion of the gate electrode in a self-alignment; hence, the TFTs are fabricated at a low yield, and moreover, the TFTs thus obtained are not uniform in quality.

SUMMARY OF THE INVENTION

The present invention provides TFTs having uniform device characteristics at a high yield by forming the high resistance regions in a self-alignment without using photolithography.

A TFT according to the present invention is shown schematically in FIG. 4B. The position and the size of high resistance (impurity) regions 12 and 14 depend on a gate insulating film 16 and a gate electrode portion (comprising a gate electrode 17 and in some cases, an anodic oxide film 17'). That is, at least one of nitrogen, oxygen, carbon, etc., is introduced into the active layer using the gate electrode portion and the gate insulating film 16 as masks. By controlling the accelerating voltage of the ions to control the depth of ion doping, the ion concentration is found to be maximum at a predetermined depth. In case nitrogen ions are introduced at an accelerating voltage of 80 kV, a maximum concentration for nitrogen ions can be achieved at a depth of 1,000 Å. Even in an active layer, the concentration of nitrogen ions differs with the depth in such a case.

In case a gate insulating film and a gate electrode portion are provided at a thickness of 1,000 Å and 3,000 Å or more, respectively, the gate electrode portion is sufficiently thick to prevent nitrogen ions from introducing into the active layer formed under the gate electrode portion. As illustrated in FIG. 4C, most of the nitrogen ions pass through the active layer 21 at a portion (shown with line B—B') where the active layer is exposed. Accordingly, nitrogen ions are found at a highest concentration at a portion under the active layer 21, e.g., the substrate. In contrast to this, a highest nitrogen ion concentration is achieved in the active layer at a portion (line A—A') where the gate electrode portion is not present and the gate insulating film 16 is present.

Accordingly, a high resistance region can be formed in a self-alignment by selectively introducing the nitrogen ions into the active layer under the portion at which the gate insulating film is present and the gate electrode portion is not present. Referring to FIG. 4D, low resistance (impurity) regions 11 and 15 and high resistance regions 12 and 14 are formed by doping an N- or P-type impurity. The N- or P-type impurity can be doped before introducing nitrogen ions.

In case of forming an anodic oxide 17' on the surface of the gate electrode 17, the high resistance regions 12 and 14 are offset from the gate electrode 17. The displacement x according to the offset depends on the thickness of the anodic oxide 17', and the low resistance regions 11 and 15 are displaced horizontally from the gate electrode 17 for a distance corresponding to the sum of the width of the region 12 and the displacement x.

According to the present invention, an oxide layer formed by anodically oxidizing the gate electrode and the like is used as the gate insulating film 16 to form the high resistance region in a self-alignment. The thickness of the anodic oxide can be precisely controlled. More specifically, the anodic oxide film can be formed uniformly at a thickness of 1,000 Å or less to a thickness of 5,000 Å or more (e.g., to 1 μm). Thus, this is preferred because a high resistance region can be formed with a greater degree of freedom, and, moreover, in case of using a self-aligned process, the high resistance region can be formed without causing fluctuation in its width.

In contrast to a so-called barrier type anodic oxide which is etched only by a hydrofluoric etchant, a porous type anodic oxide can be selectively etched by a phosphoric acid etchant and the like. Accordingly, an etching treatment can be effected without damaging other materials constituting the TFT, for example, silicon and silicon oxide. In case of dry etching, the barrier or porous anodic oxide is extremely resistant against etching, and exhibits a sufficiently high selectivity ratio in case of etching with respect to silicon oxide.

According to the present invention, a TFT can be fabricated by the following processes. Thus, high resistance regions can be formed with a higher certainty and therefore mass production is improved.

Referring to FIGS. 1A to 1E, a basic process for fabricating a TFT according to the present invention is described below. A base insulating film 102 is formed on a substrate 101. An active layer 103 is formed from a crystalline semiconductor (a semiconductor comprising a crystal even at a small quantity, for example, a single crystal semiconductor, polycrystalline semiconductor, semi-amorphous semiconductor or the like is referred to as "a crystalline semiconductor" in the present invention. An insulating film 104 comprising silicon oxide is formed to cover an active layer 103, and a coating is formed by an anodically oxidizable material. Preferably, an anodically oxidizable material such as aluminum, tantalum, titanium, and silicon, is used as the coating material. Moreover, a monolayered gate electrode using one of the above materials as well as a multi-layered gate electrode comprising two layers or more of the above materials can be utilized. For example, a double layered structure comprising titanium silicide formed on aluminum or a double layered structure comprising aluminum formed on titanium nitride can be used. Each of the layers is provided at a thickness depending on the device characteristics.

A mask film used as the mask in the anodic oxidation is formed to cover the coating and then the coating and the mask film are patterned and etched simultaneously, thereby to form a gate electrode 105 and a mask film 106. The mask film can be formed using a photoresist used in an ordinary photolithography process, a photosensitive polyimide, or a general etchable polyimide. (FIG. 1A)

A porous anodic oxide 107 is formed on both sides of the gate electrode 105 by applying an electric current to the gate electrode 105 in the electrolytic solution. The anodic oxidation is effected using an aqueous acidic solution containing from 3 to 20% of citric acid, nitric acid, phosphoric acid, chromic acid, sulfuric acid, and the like. An anodic oxide from 0.3 to 25 μm in thickness, more specifically, 0.5 μm in thickness, is formed by applying a voltage of about 10 to 30 V. The mask film 106 is removed by etching after the anodic oxidation. (FIG. 1B)

A barrier anodic oxide 108 can be formed on both sides and the upper surface of the gate electrode 105 by applying a current thereto in an ethylene glycol solution containing from 3 to 10% of tartaric acid, boric acid, or nitric acid. The thickness of the anodic oxide thus formed depend on the voltage applied between the gate electrode 105 and the electrode face thereto.

The barrier anodic oxide is formed after forming the porous anodic oxide. The barrier anodic oxide 108 is formed not on the outer side of the porous anodic oxide 107, but between the porous anodic oxide 107 and the gate electrode 105. The etching rate of a phosphoric acid etchant to a porous anodic oxide is 10 times or more higher with respect to that to a barrier anodic oxide. Accordingly, the gate electrode 105 is protected from a phosphoric acid etchant because the barrier anodic oxide 108 remains substantially unetched in a phosphoric acid etchant (FIG. 1C).

The insulating film 104 is etched by dry etching, wet etching or the like. The etching can be effected until the active layer is exposed, or it may be stopped in the intermediate state. Preferably from the viewpoint of mass production, yield, and the uniformity of the film, the insulating film is completely etched until the active layer is exposed. The thickness of the gate insulating film covered by the anodic oxide 107 and the gate electrode 105 remains unchanged during the etching. In case dry etching using a fluorine-based gas (e.g., $NF_3$ or $SF_6$) is effected on a gate electrode 105 containing mainly aluminum, tantalum, and titanium as well on an insulating film 104 containing mainly silicon oxide, the insulating film 104 made of a silicon oxide can be etched rapidly. Since the etching rate is sufficiently low for aluminum oxide, tantalum oxide, and titanium oxide, the insulating film 104 can be etched selectively. The insulating film 104 can be etched rapidly and selectively by wet etching using a hydrofluoric acid based etchant such as hydrofluoric acid diluted to 1/100 (FIG. 1D).

The anodic oxide 107 is removed thereafter. A phosphoric acid based aqueous solution, such as a mixed acid of phosphoric acid, acetic acid, and nitric acid, is preferred as the etchant.

Thus, a part of the insulating film 104 (referred to hereinafter as "gate insulating film") can be remained. A gate insulating film 104' is present under the gate electrode 105 and the barrier anodic oxide 108, as well as under the porous anodic oxide 107 to a position extended for a distance y from the edge portion of the barrier anodic oxide 108. The distance y is determined in a self-alignment. Accordingly, a region of the active layer 103 on which the gate insulating film 104' is formed and a region on which the gate insulating film 104' is not formed are for med in a self-alignment. A high resistance region containing the ions at a high concentration is formed in a self-alignment with respect to the gate electrode by introducing ions such as nitrogen, oxygen, and carbon into the active layer.

The distance x between the edge portion of the gate electrode and the edge portion of the source or the drain region (see FIG. 4D) corresponds to the offset width, and the width of the high resistance region is controlled in a self-alignment by the distance y. Referring to FIGS. 1D and 2C, the edge portion 109 of the gate insulating film 104' coincides approximately with the edge portion 121 of the high resistance portion 112. The high resistance region in a conventional technology is formed in a non-self-alignment. Accordingly, it is difficult to form the high resistance region and the gate electrode at the same position for all the TFTs on the same substrate. In the present invention, however, the width of the anodic oxide 107 can be precisely controlled by the applied current (charge) for anodic oxide.

The offset width between the gate electrode and the high resistance region can be set arbitrary by controlling the thickness of the anodic oxide 108. In general, the ON/OFF ratio increases as the reverse leak current reduces in an offset state. Thus, the TFT according to the present invention is suitable for a pixel TFT for controlling the pixels of an active matrix liquid crystal display in which a low leak current is required. However, since the hot carriers generated at the edge portions of the high resistance region are trapped by the anodic oxide, the characteristics of the TFT deteriorate.

In case of a TFT having a small offset, the deterioration of the TFT characteristics due to the trapping of hot carriers reduces and the ON current increases, but the leak current reversely increases. Accordingly, a TFT having a small offset is suitable for a TFT in which a large current drive capacity is required, for example, a driver TFT utilized in the peripheral circuits of monolithic active matrices. In practice, the TFT offset is determined by the usage of the TFT.

DETAILED DESCRIPTION OF THE PREFERRED EMBODIMENTS

EXAMPLE 1

A silicon oxide film having a thickness of 1,000 to 3,000 Å is formed as a base oxide film 102 on a Corning 7059 substrate 101 (300×400 mm or 100×100 mm in size) by sputtering in an oxygen atmosphere. For mass production, the film is deposited by decomposing TEOS using plasma CVD. A mono-layered film of aluminum nitride or a multilayered film of silicon oxide and aluminum nitride can be used as the base oxide film. The aluminum nitride film is formed by reactive sputtering in a nitrogen atmosphere.

An amorphous silicon film is deposited thereafter at a thickness of 300 to 5,000 Å, preferably, 500 to 1,000 Å, by plasma CVD or LPCVD, and is crystallized thereafter by allowing it to stand still in a reduction atmosphere in a temperature range of 550° to 600° C. for 24 hours. The crystallization may be effected by laser irradiation. Thus crystallized silicon film is patterned to form an island-like region 103. A silicon oxide film 104 having a thickness of 700 to 1,500 Å is formed by sputtering on the island-like region 103.

Figure 1A:
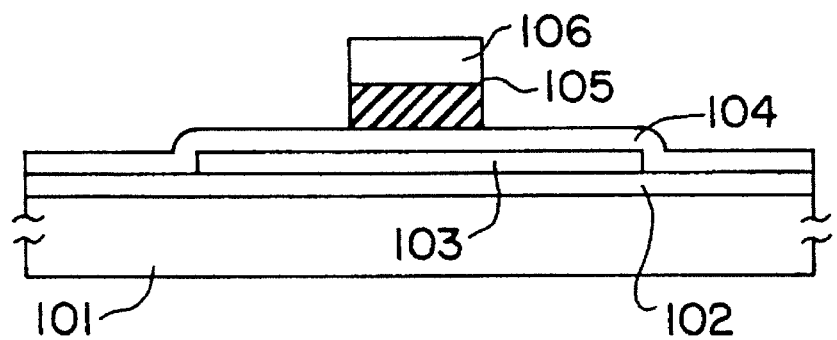
FIGS. 1A to 1E are a diagram showing the basic processes for fabricating a device according to the present invention.

An aluminum film having a thickness of 1,000 Å to 3 μm and containing 1% by weight of silicon or 0.1 to 0.3% by weight of scandium (Sc) is formed thereafter by electron beam deposition or sputtering. Then, a photoresist (for example, OFPR 800/30cp, a product of Tokyo Ohka Co., Ltd.) is formed by spin coating. The photoresist can be formed with further improved adhesion strength by forming an aluminum oxide film having a thickness of 100 to 1,000 Å by anodic oxidation on the surface of the aluminum film before formation of the photoresist. The aluminum oxide film thus formed is effective in that it prevents current leakage from occurring from the photoresist, and in that it forms a porous anodic oxide only on the sides at anodic oxidation processing. The photoresist and the aluminum film are then patterned and etched to form a gate electrode 105 and a mask film 106 (FIG. 1A).

Figure 1B:
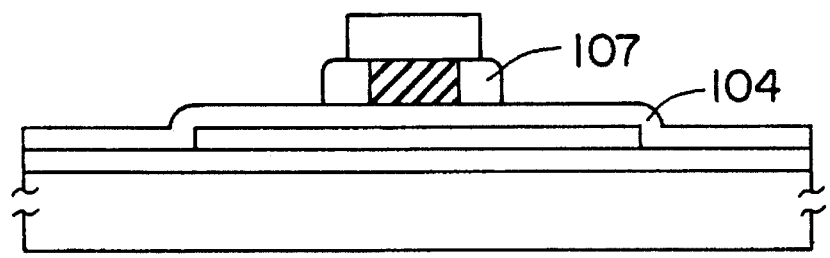

A porous anodic oxide 107 is formed at a thickness of 3,000 Å to 2 μm (for example, 5,000 ÅA), by anodic oxidation for 20 to 40 minutes, under a voltage of 10 to 30 V, specifically in this case, 10 V, in an aqueous acidic solution containing 3 to 20% of, for example, citric acid, nitric acid, phosphoric acid, and sulfuric acid. An aqueous oxalic acid solution at 30° C. is used in the present example. The thickness of the anodic oxide can be controlled by the duration of anodic oxidation (FIG. 1B).

Figure 1C:
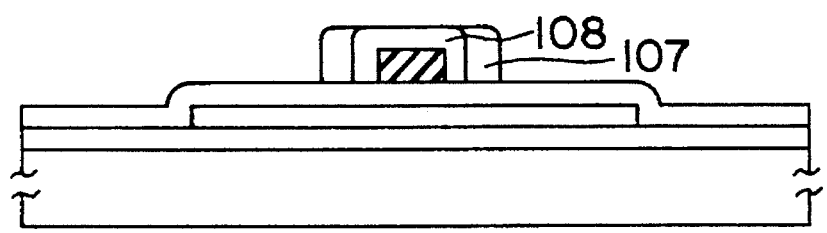

A mask film 106 is removed thereafter, and a voltage is applied to the gate electrode 105 in an electrolytic solution (i. e., an ethylene glycol solution containing from 3 to 10% of tartaric acid, boric acid, or nitric acid) to form a barrier anodic oxide 108 on the upper portion and both sides of the gate electrode. In a case wherein a solution is at about 10° C., an oxide film having a higher quality can be formed by the temperature to be lower than the room temperature. The thickness of the anodic oxide 108 thus formed increases in proportion to the applied voltage. In case a voltage of 150 V is applied, an anodic oxide having a thickness of 2,000 Å is formed. The thickness of the anodic oxide 108 is determined by the required thickness and the degree of overlap. An anodic oxide having a thickness of 3,000 Å or more can be obtained by applying a voltage of 250 V or higher. However, in general, an anodic oxide film having a thickness of 3,000 Å or less is used because the application of such a high voltage impairs the TFT characteristics. Thus, the anodic oxidation is effected by applying a voltage of 80 to 150 V depending on the thickness required for the anodic oxide film 108 (FIG. 1C).

Figure 1D:
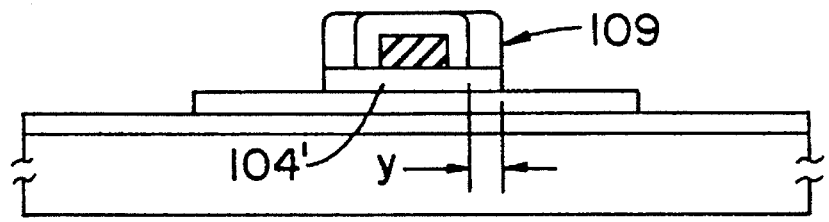

The silicon oxide film 104 is then etched by dry etching. The etching includes an isotropic etching in plasma mode and an anisotropic etching in reactive ion etching mode. The key is to set the selectivity ratio of silicon to silicon oxide to a sufficiently high value, and not to deeply etch the active layer. For example, the silicon oxide 104 alone can be etched while leaving the anodic oxide unetched by using $CF_4$ as the etching gas. The silicon oxide film 104' formed under the porous anodic oxide 107 is not etched in this process (FIG. 1D).

Figure 1E:
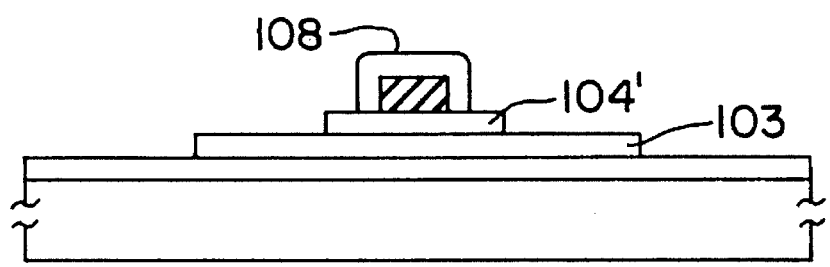

The anodic oxide 107 is etched using a mixed acid of phosphoric acid, acetic acid and nitric acid. The anodic oxide 107 alone is etched at a rate of about 600 Å/minute in this etching. The gate insulating film 104' remains unetched (FIG. 1E).

Figure 2A:
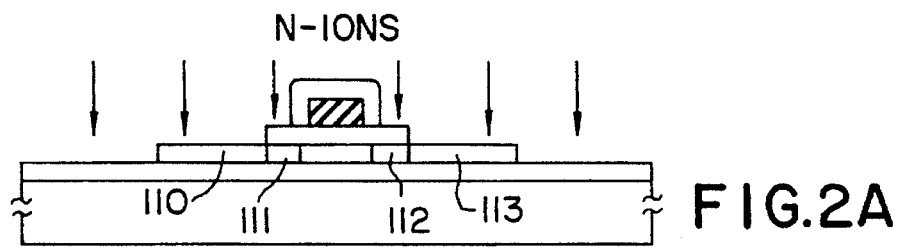
FIGS. 2A to 2C are a diagram showing the processes for fabricating a TFT according to Example 1 of the present invention.

Nitrogen ions are then doped (introduced) into the active layer 103 at a dose of $1\times10^{14}$ to $3\times10^{16}$ cm$^{-2}$, for example, $2\times10^{15}$ cm$^{-2}$, at an accelerating voltage of 50 to 100 kV, for example, at 80 kV, in a self-alignment by using the gate electrode portion (the gate electrode and the anodic oxide film at its periphery) and the gate insulating film as masks. Almost no nitrogen ions are introduced into the regions 110 and 113 on which the gate insulating film 104' is not formed. According to SIMS (secondary ion mass spectroscopy), the concentration of nitrogen in the regions 110 and 113 is $1\times10^{19}$ atoms·cm$^{-3}$ or less. On the other hand, nitrogen atoms are introduced into the regions 111 and 112 on which the gate insulating film is formed at a concentration of $5\times10^{19}$ to $2\times10^{21}$ atoms·cm$^{-3}$ depending on the depth (FIG. 2A).

Figure 2B:
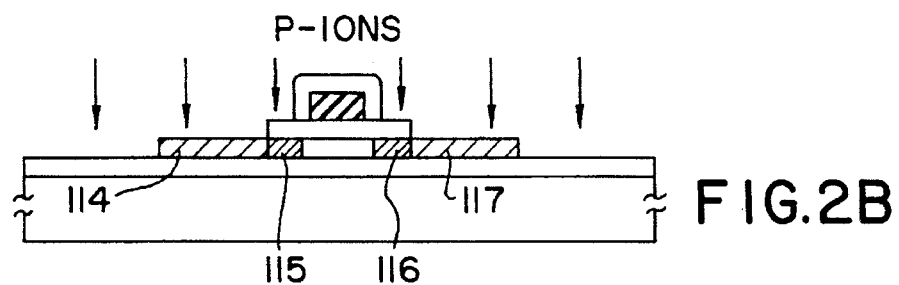

Subsequently, an N-type impurity is introduced into the active layer at a dose of $5\times10^{14}$ to $5\times10^{15}$ cm$^{-2}$ at an accelerating energy of 10 to 30 keV. By thus setting the accelerating energy to a low value, the N-type impurity can be excluded from the regions 111 and 112 because the gate insulating film functions as a barrier, but it can be introduced into the regions 110 and 113 at a sufficiently high quantity. The low resistance regions (source/drain regions) 114 and 117 and the high resistance regions 115 and 116 are formed in this manner by difference of the concentration of the N-type impurity and the nitrogen ions. Phosphine ($PH_3$) is used as the doping gas. Diborane ($B_2H_6$) can be used for forming a P-type impurity region (FIG. 2B).

The impurity ions and the nitrogen ions introduced into the active layer are activated thereafter by irradiating a laser radiation using a KrF excimer laser (a wavelength of 248 nm and a pulse width of 20 ns).

The impurity concentration in the regions 114 and 117 determined by SIMS is $1\times10^{20}$ to $2\times10^{21}$ atoms·cm$^{-3}$, and that in the regions 115 and 116 is $1\times10^{17}$ to $2\times10^{18}$ atoms·cm$^{-3}$. The dose for the former and the latter is $5\times10^{14}$ to $5\times10^{15}$ cm$^{-2}$ and $2\times10^{13}$ to $5\times10^{14}$ cm$^{-2}$, respectively.

The difference depends on whether there is a gate insulating film 104' or not. In general, the impurity concentration in the low resistance region is higher than that of the high resistance region by 0.5 to 3 digits.

Figure 2C:
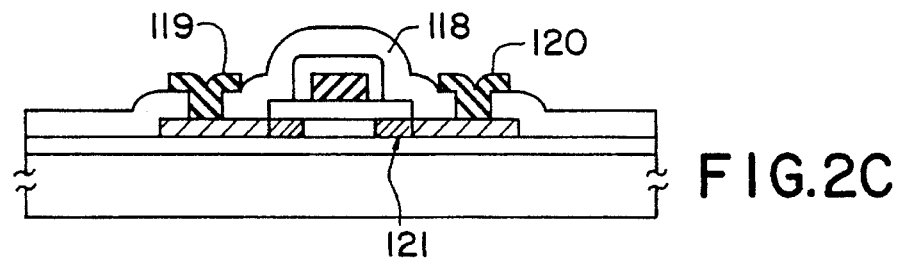

Finally, a silicon oxide film is deposited by CVD at a thickness of 2,000 Å to 1 μm, for example, 3,000 Å as an interlayer dielectric 118. After forming the contact hole, the aluminum interconnection-electrodes 119 and 120 are formed. The resulting structure is then subjected to hydrogen annealing at 200° to 400° C. to obtain a TFT (FIG. 2C).

Figure 8A:
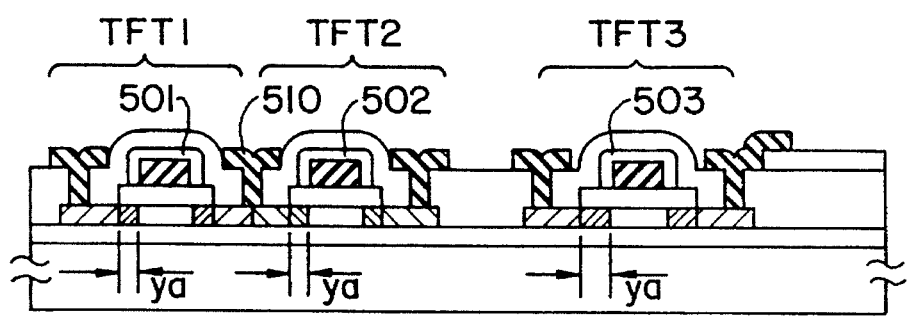
FIGS. 8A and 8B are each integrated circuits of TFTs fabricated in Examples 1 and 3 according to the present invention, accordingly.

A process for fabricating a plurality of TFTs on the same substrate as shown in FIG. 8A is described according to the processes with reference to FIGS. 1A to 1E and FIGS. 2A to 2C. FIG. 8A shows an example in which a matrix region and a peripheral driver circuit for driving the matrix region are formed monolithically on the same substrate for an active matrix electro-optical device such as a liquid crystal display.

Referring to FIG. 8A, TFT1 and TFT2 are both driver TFTs. Anodic oxide films 501 and 502 are formed with a thickness of 200 to 2,000 Å, for example, 1,000 Å. In the structure, the high resistance region slightly overlaps with the gate electrode due to the impurity ions which diffuse upon ion doping. The drain of the N-channel TFT1 and that of the P-channel TFT2 are connected with each other with an interconnection 510. Although not shown in the figure, the source of the TFT1 is grounded and the source of the TFT2 is connected to the power source to establish a CMOS invertor.

TFT3 is a pixel TFT. An anodic oxide 503 is provided at a thickness of 1,000 Å. However, the high resistance region between the drain region and the gate electrode is provided with a width of 0.4 to 2 μm, for example, 0.5 μm, in order to reduce a leak current. The width of the high resistance region in TFT1 and TFT2 is, for example, 0.2 μm. The width of the high resistance region changes according to the thickness of the porous anodic oxide. Accordingly, the gate interconnection for the TFT1 and TFT2 is separated from that for the TFT3 so as to be controlled independently from each other. Furthermore, since the width of the high resistance region in TFT3 is large, the parasitic capacitance between the gate and drain which generates upon applying a voltage can be reduced.

EXAMPLE 2

A base film 102, an active layer 103, a gate insulating film 104', a gate electrode 105, and an anodic oxide 108 are formed on a glass substrate 101 by processes similar to that described in Example 1 (FIG. 1E).

Figure 3A:
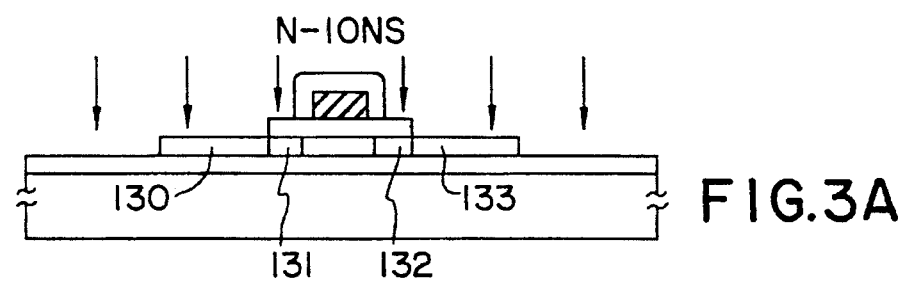
FIGS. 3A to 3C are a diagram showing the processes for fabricating a TFT according to Example 2 of the present invention.

Nitrogen ions are introduced in a self-alignment into the active layer 103 using the gate electrode and the gate insulating film as masks. The dose is $1\times10^{14}$ to $3\times10^{16}$ cm$^{-2}$, for example, $2\times10^{15}$ cm$^{-2}$. An accelerating voltage is 50 to 100 kV, for example, 80 kV. As a result, almost no nitrogen atoms are introduced into the regions 130 and 133 (the concentration of nitrogen is $1\times10^{19}$ atoms·cm$^{-3}$ or less in SIMS), but nitrogen atoms are introduced into the regions 131 and 132 at a concentration of $5\times10^{19}$ to $2\times10^{21}$ atoms·cm$^{-3}$ depending on the depth (FIG. 3A).

Figure 3B:
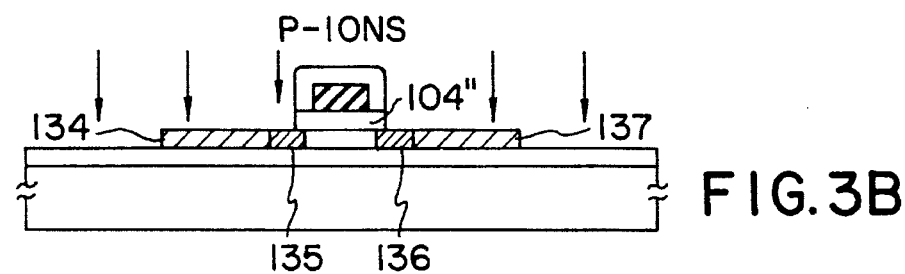

The gate insulating film 104' is etched thereafter to form a gate insulating film 104" by using the anodic oxide 108 as a mask. An N-type impurity is introduced into the active layer thereafter by ion doping at a dose of $5\times10^{14}$ to $5\times10^{15}$ cm$^{-2}$ and with an accelerating energy of 10 to 30 keV. Phosphine (PH$_3$) is used as the doping gas, but diborane (B$_2$H$_6$) can be used in case of forming a P-type impurity region. Thus impurity regions 134, 135, 136, and 137 are formed by introducing the N-type impurity at the same quantity to each of the regions 130, 131, 132, and 133. Depending on the quantity of the previously introduced nitrogen ions, the regions 134 and 137 become low resistance regions whereas the regions 134 and 136 become high resistance regions (FIG. 3B).

The impurity ions and the nitrogen ions introduced into the active layer are activated thereafter by irradiating a laser radiation using a KrF excimer laser (a wavelength of 248 nm and a pulse width of 20 ns). The impurity concentration in the regions 134, 135, 136, and 137 according to SIMS is $1\times10^{20}$ to $2\times10^{21}$ atoms·cm$^{-3}$, and the dose is $5\times10^{14}$ to $5\times10^{15}$ cm$^{-2}$.

Figure 3C:
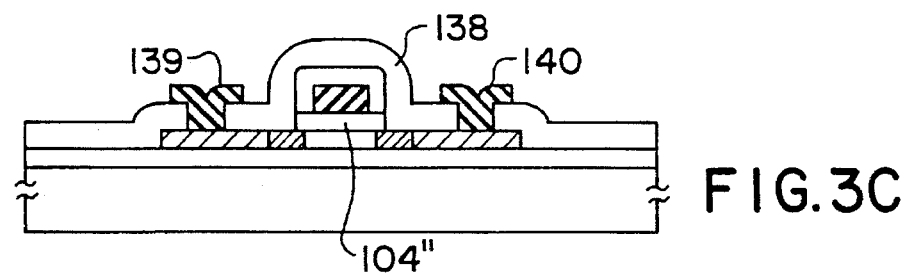
Figure 4A:
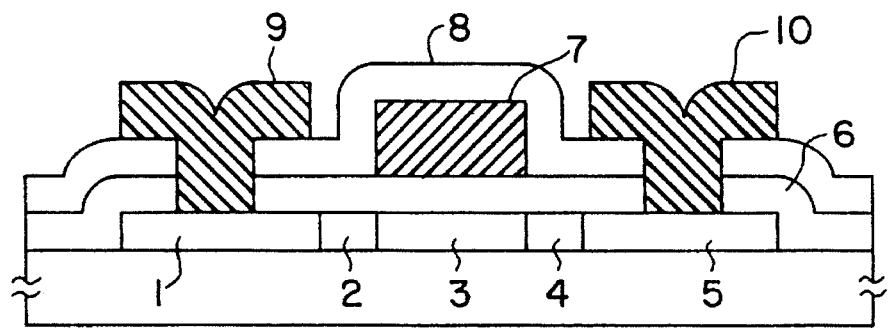
FIGS. 4A to 4D are a diagram showing the structure of TFTs according to the present invention.
Figure 4B:
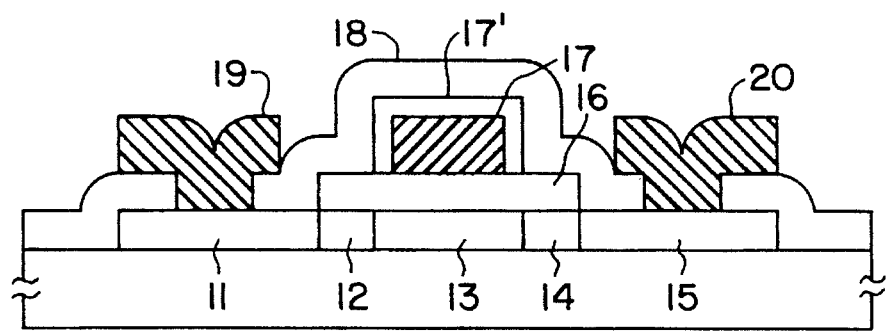
Figure 4C:
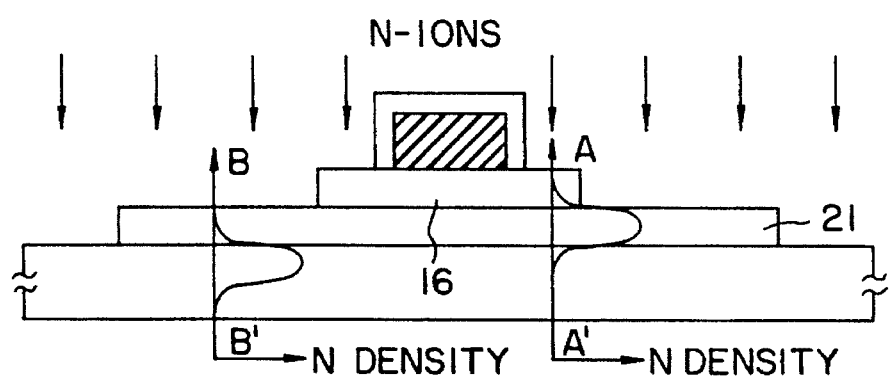
Figure 4D:
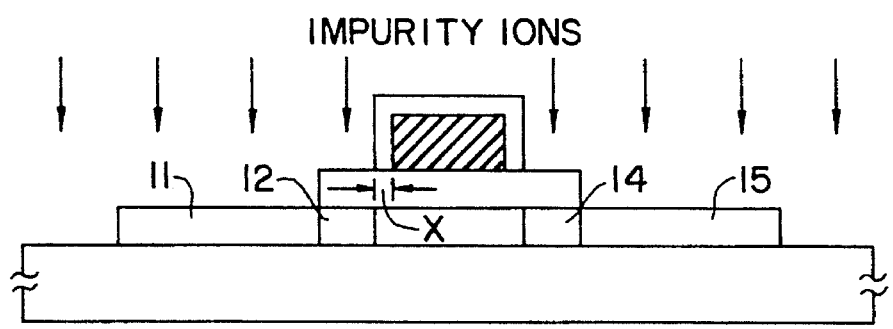

Finally, a silicon oxide film is deposited by CVD at a thickness of 3,000 Å as an interlayer dielectric 138. After forming the contact hole, an aluminum interconnection-electrodes 139 and 140 are formed. The resulting structure is then subjected to hydrogen annealing at 200° to 400° C. to obtain a TFT (FIG. 3C).

EXAMPLE 3

Figure 5A:
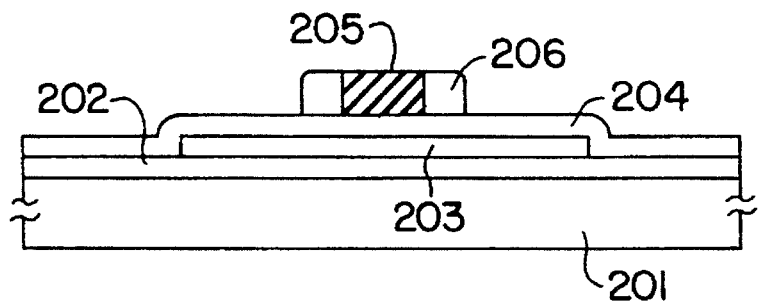
FIGS. 5A to 5F are a diagram showing the processes for fabricating a TFT according to Example 3 of the present invention.

Referring to FIGS. 5A to 5F, a method for fabricating an N-channel TFT is described below. First referring to the processes shown in FIGS. 1A and 1B, a base oxide film 202, an island-like semiconductor (e.g., a crystalline silicon semiconductor) region 203, a silicon oxide film 204, and a gate electrode 205 comprising an aluminum film (200 nm to 1 μm in thickness) are formed on a substrate 201 having an insulating surface (e.g., a Corning 7059 glass), and a porous anodic oxide 206 (3,000 Å to 1 μm in thickness, e.g., 5,000 Å) is formed in both sides of the gate electrode 205 (FIG. 5A).

Figure 5B:
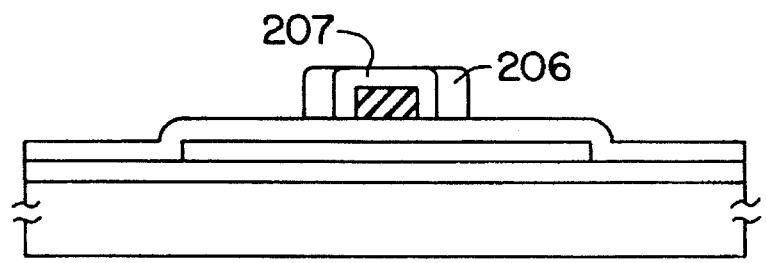

A barrier anodic oxide 207 (1,000 to 2,500 Å in thickness) is formed thereafter in the same manner as in the process described in Example 1 (FIG. 5B).

Figure 5C:
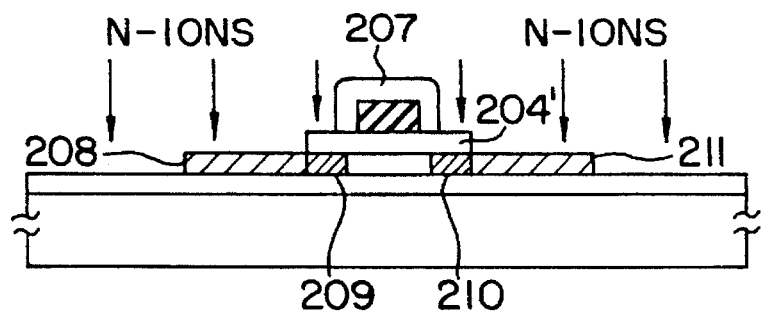

The silicon oxide film 204 is etched using the anodic oxide 206 as the mask, to form a gate insulating film 204'. Then, the anodic oxide film 206 is removed by etching using the anodic oxide film 207 as the mask. Impurity (phosphorus) is introduced by ion doping thereafter using the gate electrode 205, the film 207 and the gate insulting film 204' as the masks, to form low resistance regions 208 and 211 and the high resistance regions 209 and 210. The dose is $1\times10^{14}$ to $5\times10^{14}$ cm$^{-2}$ and an accelerating voltage is 30 to 90 kV. Nitrogen ions are introduced after introducing the impurity ions at a dose of $1\times10^{14}$ to $3\times10^{16}$ cm$^{-2}$, more specifically, $2\times10^{15}$ cm$^{-2}$, and an accelerating voltage is 50 to 100 kV, for example, 80 kV. As a result, almost no nitrogen is introduced into the low resistance regions 208 and 211, but nitrogen are introduced into the high resistance regions 209 and 210 at a concentration of $5\times10^{19}$ to $2\times10^{21}$ atoms·cm$^{-3}$ depending on the depth (FIG. 5C).

Figure 5D:
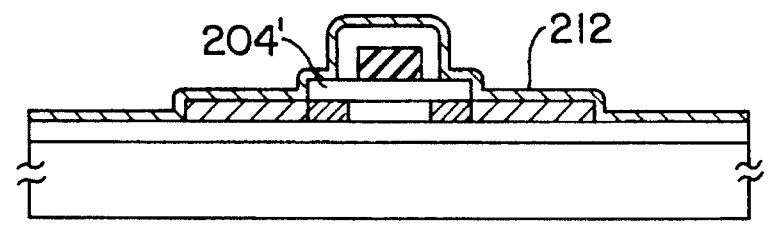

Furthermore, a metallic coating (for example, a coating of titanium, nickel, molybdenum, tungsten, platinum, or palladium), specifically, for example, titanium layer 212 is deposited by sputtering at a thickness of 50 to 500 Å, to establish a tight adhesion with the low resistance regions 208 and 211 (FIG. 5D).

A laser radiation is irradiated using a KrF excimer laser (a wavelength of 248 nm and a pulse width of 20 ns) to activate the thus introduced impurities and to form metal silicide (titanium silicide) regions 213 and 214 by allowing the titanium film to react with silicon in the active layer. The energy density is 200 to 400 μmJ/cm$^2$, preferably, 250 to 300 mJ/cm$^2$. Preferably, the substrate is heated at 200° to 500° C. upon irradiating the laser to prevent the titanium film from peeling. The laser does not need to be limited to an excimer laser, and other lasers are also usable. However, the use of a pulsed laser is preferred, because a continuous oscillated laser is irradiated for an excessively long duration, thereby to expand the object by heating and to cause film peeling.

An infrared laser such as an Nd:YAG laser (preferably, a Q-switch pulse oscillated laser), a visible light such as a second harmonic of the infrared laser, or various kinds of ultraviolet (UV) laser such as a KrF, a XeCl, an ArF, or the like excimer laser can be used as the pulse laser. However, a laser having a wavelength not reflected from a metallic film must be selected in a case wherein a laser is irradiated through the metallic film. In case the metallic film is very thin, any type of the lasers above can be used without any problem. In case the laser is irradiated through the substrate, a laser transmitted through a silicon semiconductor film must be selected.

Furthermore, lamp annealing using a visible light or a near infrared light may be employed in place of the aforementioned laser annealing. In lamp annealing, the duration of irradiation is controlled as such that the temperature of the light-irradiated surface is about 600° to 1,000° C. The duration of irradiation is, for example, several minutes at 600° C., and several tens seconds at 1,000° C. When the annealing is effected using a near infrared ray (specifically, for example, an infrared ray having a wavelength of 1.2 μm), the silicon semiconductor selectively absorbs the near infrared ray. Accordingly, the annealing can be effected without considerably heating the glass substrate. Moreover, the heating of the glass substrate can be suppressed by reducing the duration of irradiation per time.

Figure 5E:
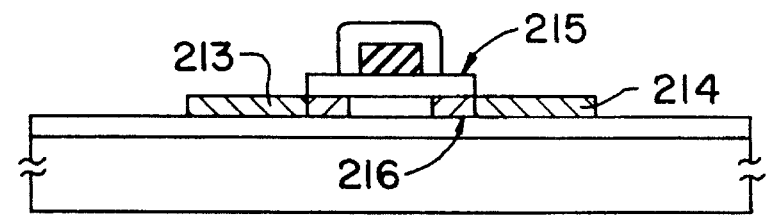

Subsequently, the titanium film is etched using an etching solution containing a 5:2:2 mixture of hydrogen peroxide, ammonia, and water. The metal silicide regions 213 and 214 remain unetched (FIG. 5E).

Figure 5F:
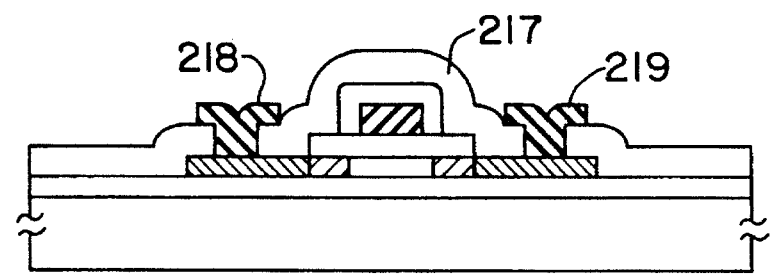

Referring to FIG. 5F, a silicon oxide film is deposited as an interlayer dielectric 217 at a thickness of 2,000 Å to 1 μm, for example, 3,000 Å. After forming a contact hole, an aluminum interconnection-electrodes 218 and 219 are formed at a thickness of 2,000 Å to 1 μm, for example, 5,000 Å. The portion which the aluminum interconnection is in contact with is made of titanium silicide. Since the interface between aluminum and titanium silicide is stabler than that between aluminum and silicon, a highly reliable contact can be obtained. The reliability of the contact can be further improved by forming titanium nitride and the like as a barrier metal between the metal silicide regions 213 and 214 and the aluminum interconnection-electrodes 218 and 219. The sheet resistance of the titanium silicide region is 10 to 50 Ω/square. The sheet resistance of the high resistance regions 209 and 210 which have the same conductivity type as that of source/drain is 10 to 500 Ω/square.

In the present example, the low resistance region 211 can be coincided approximately with the metal silicide region. The edge portion 215 of the gate insulating film 204' can be roughly coincided with the boundary 216 between the high resistance region 210 and the low resistance region 211, and the edge portion 215 can be coincided with nearly the edge portion of the metal silicide region 214.

Figure 8B:
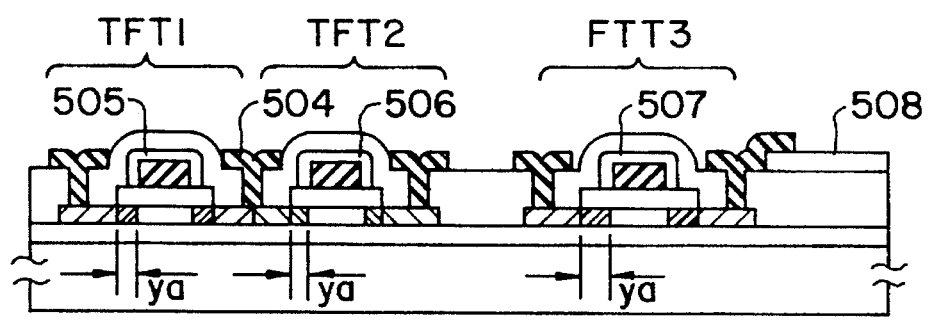

A method for fabricating a plurality of TFTs on the same substrate as shown in FIG. 8B is described with reference to FIGS. 5A to 5F. FIG. 8B shows an example in which a matrix region and a peripheral driver circuit for driving the matrix region are formed monolithically on the same substrate for an active matrix electro-optical device such as a liquid crystal display. TFT1 and TFT2 utilized as the driver TFTs are formed in a CMOS invertor structure. The anodic oxide 505 and 506 are formed at a thickness of 200 to 2,000 Å, for example, 1,000 Å. TFT3 is a pixel TFT, and comprises a 1,000 Å thick anodic oxide 507.

The thickness of the anodic oxide is selected in such a manner that the edge portions of the gate electrode be coincided with the edge portions of the source and drain regions by taking the diffusion which occurs upon ion doping into account. One of the source and drain electrodes for TFT3 is connected to the ITO pixel electrode 508. The high resistance region for the TFT3 is formed at a width ya' of 0.4 to 5 μm, for example, ya' of 0.5 μm, while the high resistance regions for the TFT1 and TFT2 is provided, for example, at a width ya of 0.2 μm. Since the width of the high resistance region changes in accordance with the thickness of the porous anodic oxide, the interconnection at anodic oxidation is set in a separate series so that the interconnection for the TFT1 and TFT2 can be controlled independently from that for TFT3. The TFT1 and the TFT3 are each an N-channel TFT, while the TFT2 is a P-channel TFT. The parasitic capacitance between the gate and drain which generates upon applying a voltage can be thus reduced by the high resistance region for TFT3 provided at a large width.

In the present Example, a titanium film is deposited after ion doping. However, doping can be effected after depositing the titanium film. Because the entire surface is coated with a titanium film upon irradiating the ion, an abnormal charging up which is often generated in use for an insulated substrate, can be prevented from occurring. Otherwise, annealing using a laser and the like is performed after ion doping, and then titanium silicide can be formed after forming the titanium film by irradiating a laser radiation and the like or by thermal annealing.

EXAMPLE 4

Figure 6A:
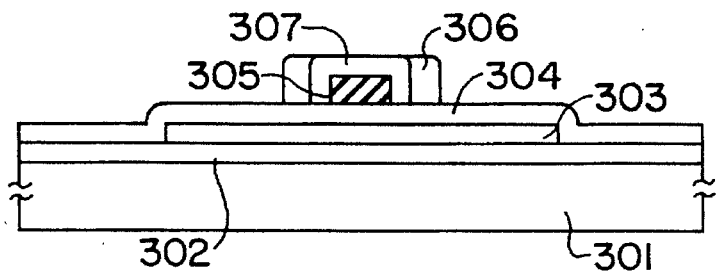
FIGS. 6A to 6F are a diagram showing the processes for fabricating a TFT according to Example 4 of the present invention.

Referring to FIGS. 6A to 6F, the present invention is described below. First referring to the processes shown in FIGS. 1A to 1C, a base oxide film 302, an island-like semiconductor (e.g., a silicon semiconductor) region 303, a silicon oxide film 304, and a gate electrode 305 comprising an aluminum film (2,000 Å to 1 μm in thickness) are formed on a substrate 301 having an insulating surface (e.g., a Corning 7059). A porous anodic oxide 306 having a thickness of 6,000 Å is formed in both sides of the gate electrode. Furthermore, a barrier anodic oxide 307 is formed between the gate electrode 305 and the anodic oxide 306 (FIG. 6A).

Figure 6B:
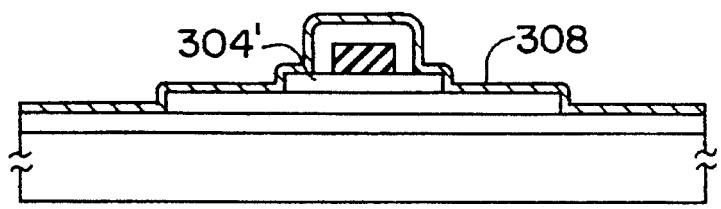

The silicon oxide film 304 is etched using the anodic oxide 306 as the mask, to form a gate insulating film 304'. Then, the anodic oxide 306 is etched to expose a part of the gate insulating film 304'. A metallic film 308, for example, a titanium film (50 to 500 Å in thickness) is formed by sputtering (FIG. 6B).

Figure 6C:
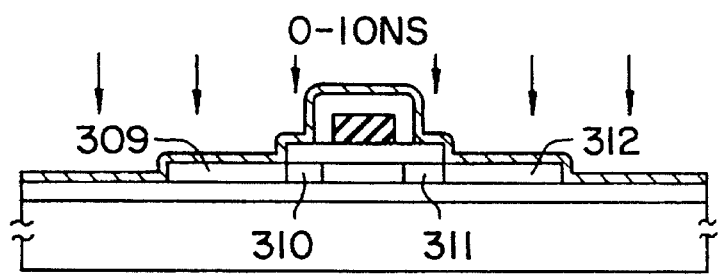

Oxygen ions are introduced in a self-alignment into the active layer 303 using the gate electrode portion and the gate insulating film as the masks. The dose is $1\times10^{14}$ to $3\times10^{16}$ cm$^{-2}$, for example, $2\times10^{15}$ cm$^{-2}$, and an accelerating voltage is 50 to 100 kV, for example, 80 kV. As a result, almost no oxygen is introduced into the regions 309 and 312 (the concentration of oxygen is $1\times10^{19}$ atoms·cm$^{-3}$ or less in SIMS), but the oxygen is introduced into the regions 310 and 311 at a concentration of $5\times10^{19}$ to $2\times10^{21}$ atoms·cm$^{-3}$ depending on the depth (FIG. 6C).

Figure 6D:
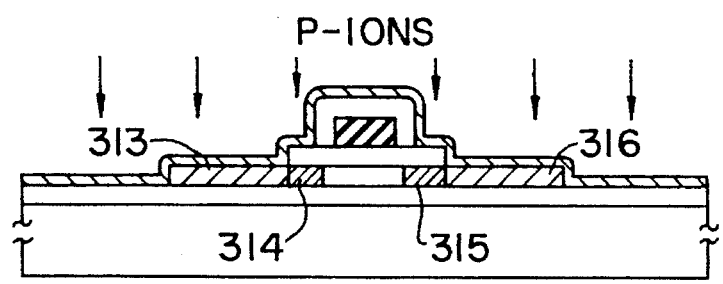

An N-type impurity is introduced into the active layer thereafter by ion doping at a dose of $5\times10^{14}$ to $5\times10^{15}$ cm$^{-2}$ and with an accelerating energy of 10 to 30 keV. By thus setting the accelerating voltage to a low value, the N-type impurity can be mostly excluded from the regions 310 and 311 because the gate insulating film functions as a barrier, but it can be introduced into the regions 309 and 312 at a sufficiently high quantity. The low resistance regions (source/drain regions) 313 and 316 and the high resistance regions 314 and 315 are formed by difference of the concentration of the N-type impurity and the oxygen ions. Phosphine (PH$_3$) is used as the doping gas. Diborane (B$_2$H$_6$) can be used for forming a P-type impurity region (FIG. 6D).

Figure 6E:
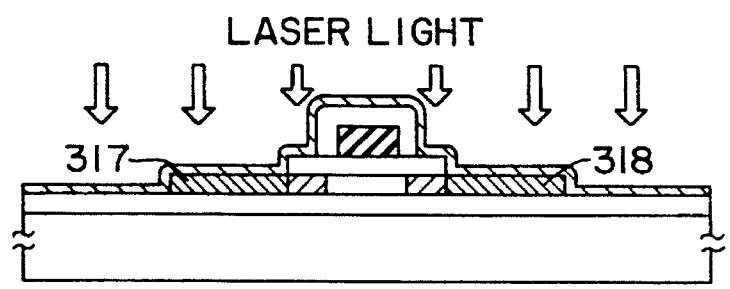

A KrF excimer laser (a wavelength of 248 nm and a pulse width of 20 ns) is irradiated to activate the impurities thus introduced into the regions 314 and 315 and to form metal silicide (titanium silicide) regions 317 and 318 by reaction of the titanium film and silicon in the active layer. The energy density is 200 to 400 mJ/cm$^2$, preferably, 250 to 300 mJ/cm$^2$. Preferably, the substrate is heated at 200° to 500° C. upon irradiating the laser to prevent the titanium film from peeling. Otherwise, lamp annealing by the irradiation of a visible light or a near infrared light can be effected (FIG. 6E).

Subsequently, the titanium film is etched using an etching solution containing a 5:2:2 mixture of hydrogen peroxide, ammonia, and water. The regions 317 and 318 remain unetched, while the gate insulating film 304' is etched using the gates 305 and 307 as the masks, to prevent the structure from being influenced by the impurities introduced into the gate insulating film 304'. Thus a gate insulating film 304" formed under the gate electrode portion remains.

Figure 6F:
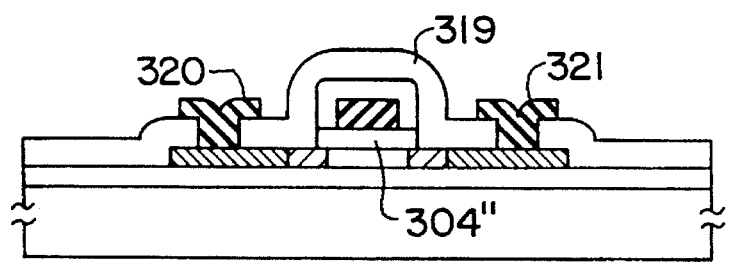

As shown in FIG. 6F, a silicon oxide film is formed by CVD at a thickness of 6,000 Å as an interlayer dielectric 319. An aluminum interconnection-electrodes 320 and 321 are formed after forming the contact hole to complete a TFT having a high resistance region.

EXAMPLE 5

Figure 7A:
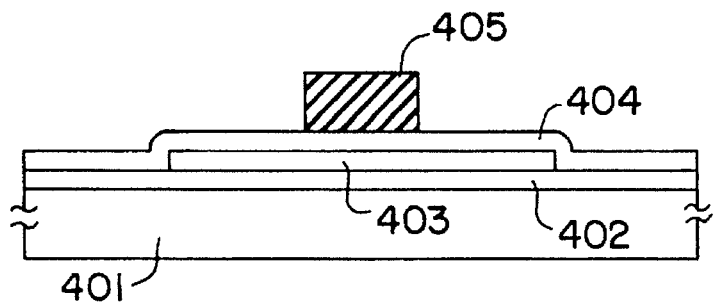
FIGS. 7A to 7F are a diagram showing the processes for fabricating a TFT according to Example 5 of the present invention.
Figure 7B:
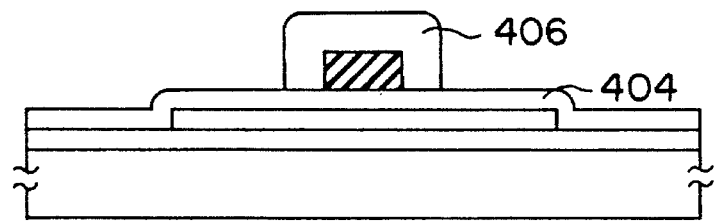
Figure 7C:
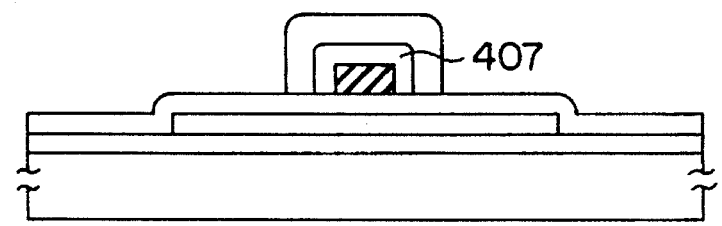
Figure 7D:
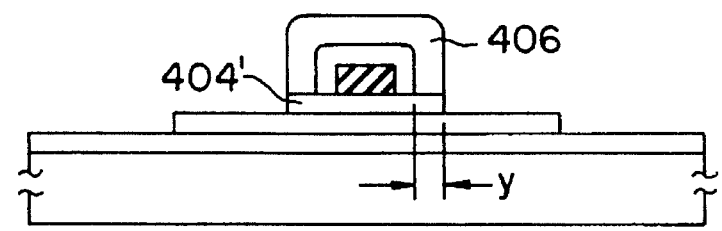

In FIG. 7A, a base oxide film 402, an island-like crystalline semiconductor (e.g., a silicon semiconductor) region 403, a silicon oxide film 404, and a gate electrode 405 comprising an aluminum film (2,000 Å to 1 μm in thickness) are formed on a substrate 401 having an insulating surface (e.g., a Corning 7059). A porous anodic oxide film 406 is formed at a thickness of 6,000 Å on the upper portion and both sides of the gate electrode (FIG. 7B). The anodic oxidation is effected under the same conditions as those employed in the case of forming the anodic oxide 107. Furthermore, a barrier anodic oxide 407 is formed between the gate electrode 405 and the anodic oxide 406 (FIG. 7C). Then, the silicon oxide film 404 is etched using the anodic oxide 406 as the mask to form a gate insulating film 404' (FIG. 7D).

The anodic oxide 406 is etched thereafter to expose the edge portion of the gate insulating film 404' for a width y (about 6,000 Å). An N-type impurity is introduced into the active layer by ion doping at a dose of $5\times10^{14}$ to $5\times10^{15}$ cm$^{-2}$ and at an accelerating energy of 10 to 30 keV. By thus setting the accelerating voltage to a low value, the N-type impurity can be mostly excluded from the regions 409 and 410 because the gate insulating film functions as a barrier, but it can be introduced into the regions 408 and 411 at a sufficiently high quantity. Phosphine (PH$_3$) is used as the doping gas. Diborane (B$_2$H$_6$) can be used for forming a P-type impurity region.

Figure 7E:
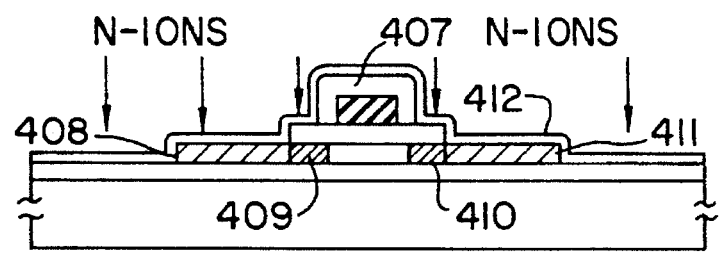

Nitrogen ions are introduced into the active layer at a dose of $1\times10^{14}$ to $3\times10^{16}$ cm$^{-2}$, for example, $2\times10^{15}$ cm$^{-2}$ and at an accelerating voltage of 50 to 100 kV, for example, 80 kV. As a result, almost no nitrogen is introduced into the regions 408 and 411, but nitrogen is introduced into the regions 409 and 410 at a concentration of $5\times10^{19}$ to $2\times10^{21}$ atoms·cm$^{-3}$ depending on the depth. The low resistance regions 408 and 411 and the high resistance regions 409 and 410 are formed by difference of the concentration of the N-type impurity and that of the nitrogen ions. A silicon nitride film 412 is deposited thereafter by plasma CVD at a thickness of 200 to 2,000 Å, for example, 1,000 Å (FIG. 7E).

A XeF excimer laser (a wavelength of 355 nm and a pulse width of 40 ns) is irradiated to activate the impurities thus introduced. The energy density is 200 to 400 mJ/cm$^2$, preferably, 250 to 300 mJ/cm$^2$. Preferably, the substrate is heated at 200° to 500° C. upon irradiating the laser. Otherwise, lamp annealing by the irradiation of a visible light or a near infrared light can be effected.

Figure 7F:
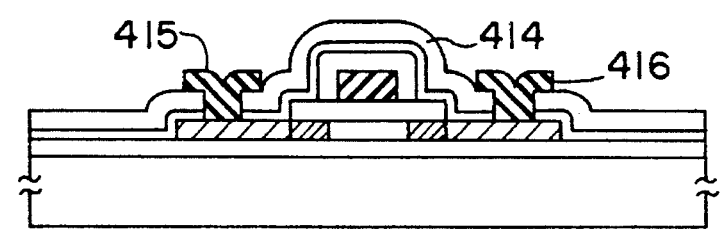

Then, as shown in FIG. 7F, a silicon oxide film is formed by CVD at a thickness of 6,000 Å as an interlayer dielectric 414. An interconnection-electrodes 415 and 416 using a multilayered film of aluminum and titanium nitride are formed after forming the contact hole to complete a TFT.

In the present invention, a silicon nitride film is formed by incorporating a gate insulating film 404' on the high resistance region 410. Accordingly, mobile ions such as sodium ions can be prevented from intruding the active layer. since a silicon nitride film traps a positive charge, the semiconductor device according to the present invention prevents a P-type parasitic channel from forming due to the negative charge trapped by the gate insulating film 404' on the high resistance region 410. As a result, a TFT having an excellent frequency characteristics and which is less affected by hot carrier deterioration even with high drain voltage can be obtained.

The silicon nitride film traps a positive charge, but has no effect on trapping a negative charge. Thus, the silicon nitride film is used in an N-channel TFT but not in a P-channel TFT. Preferably, an aluminum nitride or an aluminum oxide is used in a P-channel TFT.

In the present invention, the high resistance region into which oxygen, nitrogen, carbon, and the like are introduced can be formed in a self-alignment. Because the width of the high resistance region can be determined by an anodic oxide whose thickness can be precisely controlled. By further forming a silicon nitride film either directly or indirectly on the high resistance region, positive charges can be trapped in the silicon nitride film. Thus, the hot carrier effect can be suppressed by the hot carriers which cancel the negative charge trapped in the gate insulating film (silicon oxide).

In case of fabricating a three dimensional integrated circuit by forming the TFT according to the present invention on a substrate having thereon a semiconductor integrated circuit, the TFT is formed on an insulating surface such as of a glass or an organic resin. The TFT according to the present invention is particularly effective for an electro-optical device such as a monolithic active matrix circuit having the peripheral circuit on a same substrate.

The TFT according to the present invention can be used effectively as, for example, a pixel TFT of an active matrix circuit because it has a low reverse leak current and a high withstand voltage. For a TFT in a driver circuit, on the other hand, a high speed operation is required rather than a low leak current. Accordingly, the TFTs for use in such applications are subjected to a treatment to prevent oxygen, nitrogen, carbon, etc., from intruding into the region of the peripheral circuit.

What is claimed is:

1. A method for producing a semiconductor device comprising the steps of:

forming a semiconductor layer;

forming an insulating film on the semiconductor layer;

forming a gate film on the insulating film;

selectively forming a mask film on the gate film;

etching the gate film using the mask film, to form a gate electrode;

supplying a current to the gate electrode in an electrolytic solution, to form a first anodic oxide layer on both sides of the gate electrode;

etching the insulating film using the first anodic oxide layer as a mask, to form a gate insulating film;

removing the first anodic oxide layer; and introducing an element including at least one of oxygen, nitrogen and carbon into the semiconductor layer using the gate electrode and the gate insulating film as masks.

2. The method of claim 1 further comprising the step of anodically oxidizing the gate electrode, to form a second anodic oxide layer of a barrier type, after forming the first anodic oxide layer.

3. The method of claim 1 further comprising the step of irradiating with one of a laser and an intense light corresponding to the laser, to activate said element including at least one of oxygen, nitrogen and carbon.

4. A method of producing a semiconductor device comprising the steps of:

forming an island semiconductor film having crystallinity on a substrate;

forming an insulating film on the island semiconductor film;

forming a gate electrode on the insulating film;

anodically oxidizing the gate electrode, to form a first anodic oxide film on both sides of the gate electrode;

anodically oxidizing the gate electrode, to form a second anodic oxide film between the gate electrode and the first anodic oxide film and on the gate electrode;

etching the insulating film, to form a gate insulating film;

removing the first anodic oxide film;

introducing an element including at least one of oxygen, nitrogen and carbon into the semiconductor film; and introducing an impurity for providing one conductivity type into the semiconductor film.

5. The method of claim 4 wherein the substrate includes Corning 7059.

6. The method of claim 4 wherein the substrate has a glass transfer point of 750° C. or less.

7. The method of claim 4 wherein the gate electrode includes an anodically oxidizable material.

8. A method of producing a semiconductor device comprising the steps of:

forming an island silicon film having crystallinity on a substrate;

forming an insulating film on the silicon film;

forming an anodically oxidizable film on the insulating film;

forming a mask film on the anodically oxidizable film;

etching the anodically oxidizable film using the mask film, to form a gate electrode;

anodically oxidizing the gate electrode, to form a first anodic oxide film on both sides of the gate electrode;

removing the mask film;

anodically oxidizing the gate electrode, to form a second anodic oxide film between the gate electrode and the first anodic oxide film and on the gate electrode;

etching the insulating film, to form a gate insulating film;

removing the first anodic oxide film;

introducing an element including at least one of oxygen, nitrogen and carbon into the silicon film through the gate insulating film; and introducing an impurity for providing one conductivity type into the silicon film without passing through the gate insulating film.

9. The method of claim 8 further comprising the step of forming an oxide film on a surface of the anodically oxidizable film.

10. The method of claim 8 further comprising the step of irradiating with a laser to activate the element and the impurity.

11. The method of claim 8 wherein a concentration of the element to be introduced is $1\times10^{14}$ to $3\times10^{16}$ cm$^{-2}$ and an accelerating voltage is 50 to 100 kV.

12. The method of claim 8 wherein a concentration of the impurity to be introduced is $5\times10^{14}$ to $5\times10^{15}$ cm$^{-2}$ and an accelerating energy is 10 to 30 keV.

13. The method of claim 8 wherein the silicon film includes a high resistance region on which the gate insulating film is formed and a low resistance region.

14. A method of producing a semiconductor device comprising the steps of:

forming an island silicon film having crystallinity on a substrate;

forming an insulating film on the silicon film;

forming an anodically oxidizable film on the insulating film;

selectively forming a mask film on the anodically oxidizable film;

etching the anodically oxidizable film using the mask film, to form a gate electrode;

anodically oxidizing the gate electrode, to form a first anodic oxide film on both sides of the gate electrode;

removing the mask film;

anodically oxidizing the gate electrode, to form a second anodic oxide film between the gate electrode and the first anodic oxide film and on the gate electrode;

selectively etching the insulating film, to form a gate insulating film;

removing the first anodic oxide film;

introducing an element including at least one of oxygen, nitrogen and carbon into the silicon film through the gate insulating film;

selectively etching the insulating film using the gate electrode and the second anodic oxide film; and introducing an impurity for providing one conductivity type into the silicon film without passing through the gate insulating film.

15. A method of producing a semiconductor device comprising the steps of:

forming an island silicon film having crystallinity on a substrate having an insulating surface;

forming an insulating film on the silicon film;

forming an anodically oxidizable film on the insulating film;

selectively forming a mask film on the anodically oxidizable film;

etching the anodically oxidizable film using the mask film, to form a gate electrode;

anodically oxidizing the gate electrode, to form a first anodic oxide film on both sides of the gate electrode;

removing the mask film;

anodically oxidizing the gate electrode, to form a second anodic oxide film between the gate electrode and the first anodic oxide film and on the gate electrode;

selectively etching the insulating film, to form a gate insulating film;

removing the first anodic oxide film;

introducing an element including at least one of oxygen, nitrogen and carbon into the silicon film through the gate insulating film;

introducing an impurity for providing one conductivity type into the silicon film without passing through the gate insulating film;

forming a metal film on a region of the silicon film on which the gate insulating film is not formed; and reacting the metal with the region by laser radiation, to form a metal silicide region.

16. The method of claim 15 further comprising the step of heating the substrate during the laser radiation.

17. A method of producing a semiconductor device comprising the steps of:

forming an island silicon film having crystallinity on a substrate having an insulating surface;

forming an insulating film on the silicon film;

forming an anodically oxidizable film on the insulating film;

selectively forming a mask film on the anodically oxidizable film;

etching the anodically oxidizable film using the mask film, to form a gate electrode;

anodically oxidizing the gate electrode, to form a first anodic oxide film on both sides of the gate electrode;

removing the mask film;

anodically oxidizing the gate electrode, to form a second anodic oxide film between the gate electrode and the first anodic oxide film and on the gate electrode;

selectively etching the insulating film, to form a gate insulating film;

removing the first anodic oxide film;

forming a metal film on a region of the silicon film on which the gate insulating film is not formed;

introducing an element including at least one of oxygen, nitrogen and carbon into the silicon film through the gate insulating film;

introducing an impurity for providing one conductivity type into the silicon film without passing through the gate insulating film; and reacting the metal with the region by laser radiation, to form a metal silicide region.

18. A method of producing a semiconductor device comprising the steps of:

forming an island silicon film having crystallinity on a substrate having an insulating surface;

forming an insulating film on the silicon film;

forming an anodically oxidizable film on the insulating film;

selectively forming a mask film on the anodically oxidizable film;

etching the anodically oxidizable film using the mask film, to form a gate electrode;

removing the mask film;

anodically oxidizing the gate electrode, to form a first anodic oxide film on both sides of the gate electrode and on the gate electrode;

anodically oxidizing the gate electrode, to form a second anodic oxide film between the gate electrode and the first anodic oxide film;

selectively etching the insulating film using the first anodic oxide film as a mask, to form a gate insulating film;

removing the first anodic oxide film;

introducing an element including at least one of oxygen, nitrogen and carbon into the silicon film through the gate insulating film;

introducing an impurity for providing one conductivity type into the silicon film without passing through the gate insulating film; and forming a silicon nitride film on at least the gate insulating film.

* * * * *